(12) United States Patent
Johansson et al.

(10) Patent No.: US 6,288,596 B1
(45) Date of Patent: Sep. 11, 2001

(54) GATE BIASING ARRANGEMENT TO TEMPERATURE COMPENSATE A QUIESCENT CURRENT OF A POWER TRANSISTOR

(75) Inventors: Jan Johansson, Upplands Väsby; Per Ericsson, Sundbyberg; Nils Af Ekenstam, Solna, all of (SE); Henrik Sjödén, Morgan Hill, CA (US)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/489,947

(22) Filed: Jan. 24, 2000

(30) Foreign Application Priority Data

Jan. 25, 1999 (SE) .................................................... 9900210

(51) Int. Cl.[7] ............................ H01L 35/00; H01L 37/00; H03K 3/42; H03K 17/78
(52) U.S. Cl. ............................ 327/512; 327/108; 327/427
(58) Field of Search ..................................... 327/108, 427, 327/430, 431, 434, 435, 512; 307/126, 130

(56) References Cited

U.S. PATENT DOCUMENTS

| | | | |
|---|---|---|---|
| 4,473,762 | 9/1984 | Iwahashi et al. . | |
| 5,027,082 | * 6/1991 | Wisherd et al. | 330/277 |
| 5,045,822 | * 9/1991 | Mohwinkel | 333/124 |
| 5,204,561 | * 4/1993 | Rischmüller | 327/427 |
| 5,633,610 | * 5/1997 | Mackawa et al. | 327/355 |
| 5,764,098 | * 6/1998 | Taga et al. | 327/541 |
| 5,808,496 | 9/1998 | Thiel . | |
| 6,150,852 | * 11/2000 | Aparin | 327/103 |

FOREIGN PATENT DOCUMENTS

0606094A2   7/1994   (EP) .

* cited by examiner

Primary Examiner—Timothy P. Callahan
Assistant Examiner—Quan Tra
(74) Attorney, Agent, or Firm—Burns, Doane, Swecker & Mathis, L.L.P.

(57) ABSTRACT

To eliminate the temperature dependency of the quiescent current of a power transistor (1), the gate bias voltage of the power transistor (1) is controlled by means of the output voltage of a biasing transistor (3) residing on the same silicon chip as the power transistor (1), and by interconnecting the gate (G3) and drain (D3) of the biasing transistor (3) and feeding it with a constant current (IB) from external circuitry.

6 Claims, 2 Drawing Sheets

US 6,288,596 B1

GATE BIASING ARRANGEMENT TO TEMPERATURE COMPENSATE A QUIESCENT CURRENT OF A POWER TRANSISTOR

TECHNICAL FIELD

The invention relates generally to LDMOS (Laterally Diffused Metal Oxide Semiconductor) transistors and more specifically to a gate biasing arrangement for an RF power LDMOS field effect transistor for temperature compensation of its quiescent current.

BACKGROUND OF THE INVENTION

The appended drawing, FIG. 1A illustrates a conventional way of biasing the gate G of an RF power LDMOS field effect transistor 1 to a gate voltage VG that gives a desired value of quiescent current IDQ of the transistor 1. The RF signal is supplied to the gate G via a terminal 2.

To bias the gate G of the transistor 1, a fixed resistor R1 is connected between the gate G and the source S, which normally is connected to ground, and a variable resistor R2 is connected between the gate G and a terminal at a positive voltage. By means of the resistor R2, the gate voltage VG is adjusted to a value that gives the desired quiescent current IDQ through the transistor 1.

The value of the quiescent current IDQ is commonly chosen to give a flat gain versus output power characteristic. Any deviation from this chosen IDQ value will degrade the linearity performance of the transistor.

For a given value of the gate voltage VG, the quiescent current IDQ is temperature dependent. Consequently, temperature changes will cause degradation of the performance of the transistor 1.

The temperature coefficient of the transistor's quiescent current is a function of the gate bias voltage. The relatively low values of the gate bias voltage VG that are normally used, gives a positive temperature coefficient, i.e. the quiescent current IDQ increases with temperature.

A common approach to reduce the variation of the quiescent current IDQ with changes in temperature is to introduce a discrete diode DI in series with the resistor R1 as shown in FIG. 1B. The voltage drop across the diode decreases as the temperature increases and thus partially eliminates the RF transistor's quiescent current temperature dependence.

There are however two apparent drawbacks of using a diode for temperature compensation. Firstly, the temperature characteristic of a diode does not exactly track the temperature characteristic of an RF LDMOS transistor. Secondly, it is hard to achieve a good thermal coupling between a discrete diode and the transistor, resulting in different temperatures for the two components.

SUMMARY OF THE INVENTION

The object of the invention is to eliminate the temperature dependency of the quiescent current of the power transistor.

This is attained by controlling the gate bias voltage of the power transistor by means of the output voltage of a biasing transistor residing on the same silicon chip as the power transistor, and by interconnecting the gate and drain of the biasing transistor and feeding it with a constant current from external circuitry.

Since the gate and drain of the biasing transistor are connected to each other, the gate voltage of the biasing transistor will automatically adjust to sustain the forced drain current. Due to the inherent temperature dependence of the biasing transistor, the gate bias voltage will decrease as temperature increases. Consequently, the gate bias voltage of the power transistor will decrease with increasing temperature resulting in a constant quiescent current IDQ.

The invention will also handle the case where the gate bias is higher, resulting in a negative temperature coefficient of the quiescent current.

BRIEF DESCRIPTION OF THE DRAWING

The invention will be described more in detail below with reference to the appended drawing on which

DETAILED DESCRIPTION

Figure 1A:
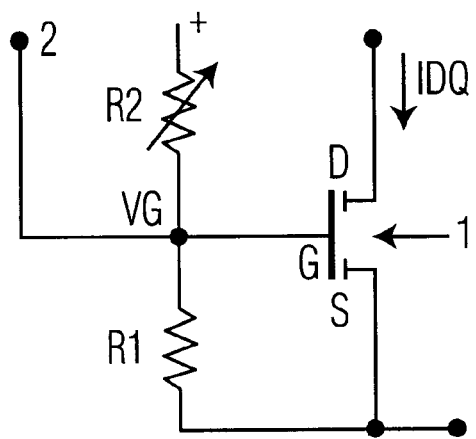
Figure 1B:
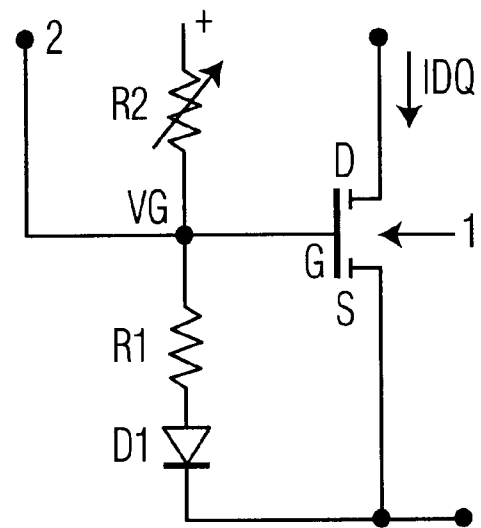
Figure 2:
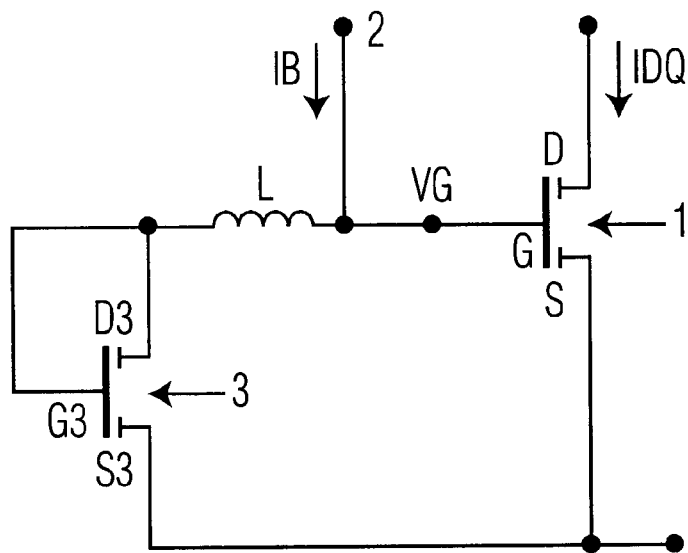
FIGS. 2 and 3 illustrate first and second embodiments, respectively, of a gate biasing arrangement according to the invention.
Figure 3:
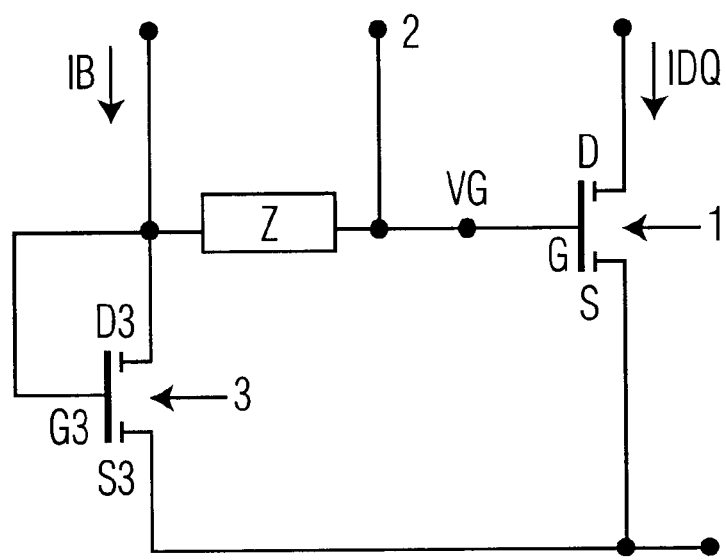

In FIGS. 2 and 3, circuit elements that are identical to circuit elements in FIGS. 1A and 1B described above are provided with the same reference characters.

In FIG. 2, a first gate biasing arrangement in accordance with the invention is illustrated for the RF power LDMOS transistor 1, which is identical to the transistor shown in FIGS. 1A and 1B.

As in FIGS. 1A and 1B, the RF signal is supplied to the gate G of the power transistor 1 via the terminal 2 in FIG. 2.

The gate biasing arrangement according to the invention, comprises a biasing LDMOS field effect transistor 3 which has its gate G3 and drain D3 interconnected, which is connected with its interconnected gate G3 and drain D3 to the gate G of the power transistor via an inductor L, and which is connected with its source S3 to the source S of the power transistor 1.

In accordance with the invention, the interconnected gate G3 and drain D3 of the biasing transistor 3 is to be supplied with a constant biasing DC current.

In FIG. 2, this constant biasing current IB is supplied by external circuitry (not shown) via the RF signal input terminal 2 together with incoming RF signals. The inductor L is used to isolate the incoming RF signals from the biasing transistor 3.

The output voltage from the biasing transistor 3 controls the gate biasing voltage VG of the power transistor 1.

The output voltage from the biasing transistor 3 will decrease as temperature increases since the input biasing current IB is fixed. Consequently, the gate bias voltage VG of the power transistor 1 will also decrease with increasing temperature to keep the quiescent current IDQ constant.

Thus, the temperature dependency of the quiescent current IDQ for the power transistor 1 will be eliminated.

The current value ratio IDQ/IB is a function of the difference in size between the power transistor 1 and the biasing transistor 3.

In accordance with an embodiment of the invention, the biasing transistor 3 resides on the same silicon chip (not shown) as the power transistor 1 to optimize temperature tracking, and the biasing transistor 3 is much smaller than the power transistor 1, e.g. more than 100 times smaller.

It should be pointed out that the current ratio will not be precisely equal to the ratio in transistor size since the biasing transistor 3 operates at a much lower drain-to-source voltage than the power transistor.

The inductor L for isolating the biasing transistor 3 from the RF signals in FIG. 2 can be integrated on the same chip as the transistors 2 and 3, but can also be a discrete element outside the chip FIG. 3 illustrates a second embodiment of a gate biasing arrangement in accordance with the invention.

The embodiment in FIG. 3 is almost identical to the embodiment in FIG. 2 in that a biasing LDMOS transistor 3 having its gate G3 and drain D3 interconnected, is connected with its interconnected gate G3 and drain D3 to the gate G of a power LDMOS transistor 1 via an RF signal isolating means which in this embodiment is a high impedance element Z, realized either as a resistor or an inductor. A resistor might be chosen for ease of integration with the transistor.

However, in the embodiment in FIG. 3, the interconnected gate G3 and drain D3 of the biasing transistor 3 are not supplied with the constant biasing current IB via the RF signal input terminal 2 of the power transistor 1. Instead, the interconnected gate G3 and drain D3 are supplied with the constant biasing current IB directly from an external current source (not shown).

From the above, it should be apparent that the temperature dependency of the quiescent current of a power transistor can be eliminated by controlling the gate bias voltage of the power transistor by means of the output voltage of a biasing transistor residing on the same silicon chip as the power transistor, and by interconnecting the gate and drain of the biasing transistor and feeding it with a constant current from external circuitry.

What is claimed is:

1. An arrangement comprising:

an RF power LDMOS transistor in a chip;

a biasing LDMOS transistor, in the chip, having its gate and drain interconnected at an interconnection point, the biasing LDMOS transistor connected to a gate of the RF power LDMOS transistor via an RF isolating means, and a source of the biasing LDMOS transistor is connected to a source of the RF power LDMOS transistor, wherein the interconnection point between the gate and the drain of the biasing LDMOS transistor is connected to a terminal and is supplied with an externally generated constant biasing current such that the quiescent current of the RF power LDMOS transistor independent of chip temperature.

2. The arrangement of claim 1, wherein the biasing LDMOS transistor is smaller than the RF power LDMOS transistor.

3. The arrangement of claim 2, wherein the biasing LDMOS transistor is more than 100 times smaller than the RF power LDMOS transistor.

4. The arrangement of claim 1, wherein said RF isolating means is an inductor, and wherein the interconnection point between the gate and the drain of the biasing LDMOS transistor is connected to said terminal via said inductor.

5. The arrangement of claim 1, said RF isolating means is a resistor, wherein the interconnection point between the gate and drain of the biasing transistor is directly connected to said terminal.

6. An arrangement comprising:

RF power LDMOS transistor;

a biasing LDMOS transistor having its gate and drain interconnected at an interconnection point, the biasing LDMOS transistor connected to a gate of the RF power LDMOS transistor via an RF isolating means, and a source of the biasing LDMOS transistor is connected to a source of the RF power LDMOS transistor, wherein the interconnection point between the gate and the drain of the biasing LDMOS transistor is connected to a terminal and is supplied with an externally generated constant biasing current such that the quiescent current of the RF power LDMOS transistor independent of chip temperature, and wherein the biasing LDMOS transistor is more than 100 times smaller than the RF power LDMOS transistor.

* * * * *